(12) United States Patent
Miyasaka

(10) Patent No.: US 10,867,901 B2
(45) Date of Patent: Dec. 15, 2020

(54) SEMICONDUCTOR MODULE AND SEMICONDUCTOR DEVICE USING THE SAME

(71) Applicant: FUJI ELECTRIC CO., LTD., Kawasaki (JP)

(72) Inventor: Toshiyuki Miyasaka, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/362,046

(22) Filed: Mar. 22, 2019

(65) Prior Publication Data

US 2019/0355657 A1    Nov. 21, 2019

(30) Foreign Application Priority Data

May 16, 2018  (JP) .................................. 2018-94977

(51) Int. Cl.
  *H01L 23/498*  (2006.01)
  *H01L 23/34*   (2006.01)
  *H01L 23/31*   (2006.01)

(52) U.S. Cl.
  CPC .... *H01L 23/49844* (2013.01); *H01L 23/3121* (2013.01); *H01L 23/34* (2013.01)

(58) Field of Classification Search
  CPC ......... H01L 23/3121; H01L 2924/3511; H01L 2924/181; H01L 23/4006; F16B 17/00
  See application file for complete search history.

(56) References Cited

U.S. PATENT DOCUMENTS

| 2013/0120915 A1* | 5/2013 | Eichner | ................. F16B 33/004 361/679.01 |
| 2014/0374896 A1* | 12/2014 | Nishida | ............... H01L 21/4882 257/712 |
| 2015/0289356 A1* | 10/2015 | Izuo | ........................ H01L 23/13 361/709 |

FOREIGN PATENT DOCUMENTS

| JP | 5-10776 U    | 2/1993  |
| JP | 5-58267 U    | 8/1993  |
| JP | 9-129823 A   | 5/1997  |
| JP | 9-139463 A   | 5/1997  |
| JP | 3075051 U    | 2/2001  |
| JP | 2001-300503 A | 10/2001 |
| JP | 2010-206104 A | 9/2010  |

\* cited by examiner

*Primary Examiner* — Jay C Chang
*Assistant Examiner* — Mikka Liu

(57) ABSTRACT

A semiconductor module includes: a sealing resin sealing an insulation circuit board so that a second metal layer is exposed to a rear plane and the rear plane is warped downward in a convex shape; and a cylindrical member including a center outer peripheral surface formed such that an upper portion is embedded in the sealing resin and including an unevenness and a lower outer peripheral surface provided below the center outer peripheral surface and smoother than the center outer peripheral surface and provided such that a bottom plane of a lower end of the lower outer peripheral surface is exposed from the rear plane of the sealing resin and the lower outer peripheral surface above the lower end of the lower outer peripheral surface is sealed by the sealing resin and is disposed near the end of the sealing resin in relation to the insulation circuit board.

14 Claims, 13 Drawing Sheets

FIG. 8

| | RESIN STRESS [MPa] | | RESIN CRACK | SEPARATION OF CYLINCRICAL MEMBER |
|---|---|---|---|---|
| | STRESS CONCENTRATION PORTION 15a | STRESS CONCENTRATION PORTION 15b | | |
| EXAMPLE (1) | 66.8 | 69.5 | ALMOST ABSENT | ABSENT |
| FIRST COMPARATIVE EXAMPLE (1x) | 119.3 | 124.9 | PRESENT | ABSENT |
| SECOND COMPARATIVE EXAMPLE (1y) | 64.9 | 69.3 | | PRESENT |

SEMICONDUCTOR MODULE AND SEMICONDUCTOR DEVICE USING THE SAME

CROSS-REFERENCE TO RELATED APPLICATION

This application claims the benefit of foreign priority to Japanese Patent Application No. JP2018-094977, filed May 16, 2018, which is incorporated by reference in their entirety.

BACKGROUND OF THE INVENTION

1. Field of the Invention

The present invention relates to a semiconductor module including a power semiconductor chip mounted on the semiconductor module and a semiconductor device using the semiconductor module.

2. Description of the Related Art

Generally, when a semiconductor module including a printed wiring board or an insulation circuit board equipped with a semiconductor chip is attached to an external device such as a cooler, an attachment method of forming a fixed hole in an end of a resin to be an exterior and inserting a screw into the fixed hole is used in some cases. For example, when the semiconductor module including the insulation circuit board sealed by a resin is screwed to the external device, a metallic cylindrical member can be interposed between the fixed hole and the screw so that the screwing operation is performed with a larger load. The cylindrical member is used to prevent the crack of the sealing resin by receiving an excessive stress locally generated in the vicinity of the screw.

As an example of the cylindrical member, JP 2010-206104 A (PTL 1) discloses a cylindrical bolt hole which is formed in an outer resin portion of a reactor and is made of a smooth metal pipe without machining an outer peripheral surface. Further, JP H09-139463 A (PTL 2) discloses a smooth ring-shaped metal fitting which is attached to a screw hole portion of a plastic casing of a semiconductor device without machining an outer peripheral surface.

Further, there is a case in which knurling or the like is performed on an entire outer peripheral surface of a cylindrical member to form an unevenness structure so that an unevenness of a surface of the cylindrical member mechanically engages with a peripheral sealing resin. For example, JP H09-129823 A (PTL 3) discloses a technique of performing knurling on an outer peripheral surface of a metal cylinder disposed inside an attachment hole of a resin casing of a semiconductor device. Further, JP 2001-300503 A (PTL 4) discloses a technique of performing knurling on an outer surface of a cylindrical insert metal fitting of a resin molded product such as an intake manifold. Further, JP 3075051 U (PTL 5) discloses a technique of performing knurling on an outer peripheral surface of a cylindrical fixed metal fitting embedded in a member made of a synthetic resin such as PC.

Since a contact area is increased by the engagement using such an unevenness structure, the unity increases and hence the separation of the cylindrical member from the sealing resin is prevented. As an example of the unevenness structure, for example, JP H05-058267 U (PTL 6) discloses a cylindrical insert metal fitting which is used to a synthetic resin or an adhesive and is formed such that knurling is performed on an outer peripheral surface and an annular concave portion is formed in a lower end of a cylinder.

In general, since the linear expansion coefficient of each component of the semiconductor module or the specific linear expansion coefficient of each material is different or thermal stress is generated during an assembly process, the sealing resin of the semiconductor module is warped. In a case in which the semiconductor module which is in a warpage state is screwed to an external device, the warpage state can be corrected by the tightening force of the screw. However, since locally remarkably large stress is applied into the sealing resin, in particular, the periphery of the unevenness structure of the cylindrical member, a resin crack occurs.

JP H05-010776 U (PTL 7) discloses a technique of integrally forming an attachment portion with an attachment hole for attaching an attachment bolt with a fuel distribution pipe body made of a synthetic resin material and used for an internal combustion engine. In the case of PTL 7, since a metallic insert member including an unevenness surface formed on an outer peripheral surface is insert-molded in the attachment portion, it is possible to prevent the crack of the attachment portion made of a synthetic resin material. However, there is no consideration of detailed solution means for preventing the resin crack generated when correcting the warpage state of the resin at the time of screwing the semiconductor module.

SUMMARY OF THE INVENTION

With the examination of the present inventor, it is proved that the resin crack easily occurred since the stress applied to a lower area adjacent to the cylindrical member remarkably increased particularly when screwing the sealing resin provided at both ends of the cylindrical member with the unevenness structure.

The invention has been made in view of the above-described problems and an object of the invention is to provide a semiconductor module and a semiconductor device with high breakage tolerance for preventing a resin crack caused when correcting a warpage state due to a screwing operation.

In order to solve the above-described problems, some aspects of the semiconductor module according to the invention includes: an insulation circuit board including a metal layer formed on a lower plane; a sealing resin including a rear plane and sealing the insulation circuit board so that the metal layer is exposed to the rear plane and the rear surface is warped downward in a convex shape; and a cylindrical member including a first outer peripheral surface embedded in the sealing resin and including an unevenness and a second outer peripheral surface provided below the first outer peripheral surface and smoother than the first outer peripheral surface and provided such that a bottom plane of a lower end of the second outer peripheral surface is exposed from the rear plane of the sealing resin and at least a part of the second outer peripheral surface above the lower end of the second outer peripheral surface is sealed by the sealing resin and is disposed near the end of the sealing resin in relation to the insulation circuit board.

Further, some aspects of the semiconductor device according to the invention includes: a semiconductor module including an insulation circuit board including a metal layer formed on a lower plane, a sealing resin including a rear plane, sealing the insulation circuit board so that the metal layer is exposed to the rear plane, and being urged so that an end of the rear plane is warped upward in relation to a center of the rear plane, and a cylindrical member including a first outer peripheral surface embedded in the sealing resin and including an unevenness and a second outer peripheral surface provided below the first outer peripheral surface and smoother than the first outer peripheral surface and provided such that a bottom plane of a lower end of the second outer peripheral surface is exposed from the rear plane of the sealing resin and at least a part of the second outer peripheral surface above the lower end of the second outer peripheral surface is sealed by the sealing resin and is disposed near the end of the sealing resin in relation to the insulation circuit board; a heat transfer material provided while being in contact with a lower plane of the metal layer of the semiconductor module; an external device being in contact with the heat transfer material; and a fixed member inserted through the cylindrical member and fixed to the external device.

BRIEF DESCRIPTION OF THE DRAWINGS

FIG. 8 is a diagram showing a measurement result of the magnitude of stress applied to a stress concentration portion, the presence or absence of resin crack, and the presence or absence of separation of the cylindrical member at the time of screwing the semiconductor modules according to an example, the first comparative example, and the second comparative example;

DETAILED DESCRIPTION

Figure 1:
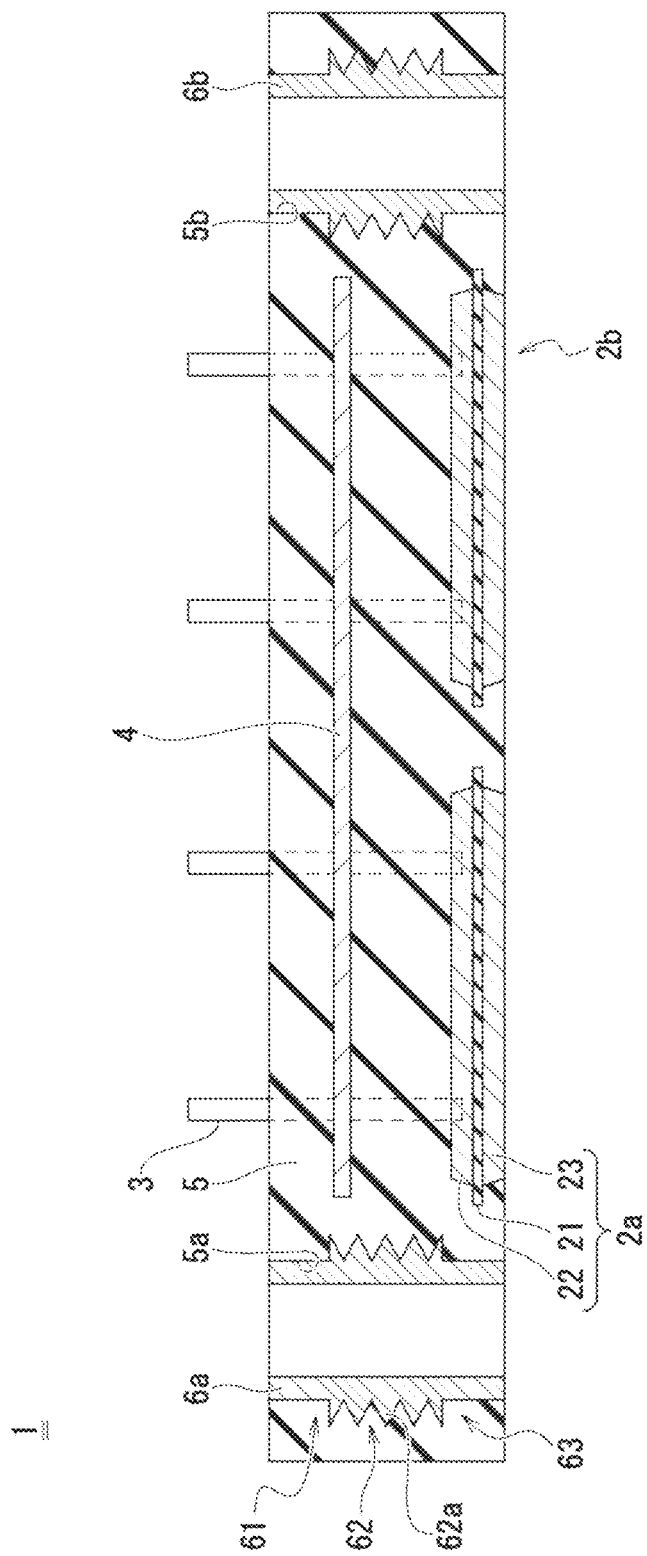
FIG. 1 is a cross-sectional view schematically describing an outline of a configuration of a semiconductor module according to an embodiment of the invention.

Hereinafter, an embodiment of the invention will be described. In the description of the following drawings, the same or similar reference numerals are given to the same or similar parts. However, it should be noted that the drawings are schematic and the relationship between the thickness and the plane dimensions, the ratio of the thickness of each device and each member, and the like are different from the actual ones. Thus, detailed thickness and dimension should be determined in consideration of the following explanation. Of course, the drawings also include parts having different dimensional relationships and ratios. In addition, the directions of the "right to left" and the "up to down" in the following description are merely for the convenience of description and do not limit the technical spirit of the invention. Thus, for example, the "right to left" and the "up to down" are read in a changed state when the page is rotated by 90°. Further, the "left" is read while being changed to the "right" and the "right" is read while being changed to the "left" when the page is rotated by 180°.

—Semiconductor Module—

As illustrated in FIG. 1, a semiconductor module 1 according to the embodiment of the invention includes a pair of insulation circuit boards 2a and 2b, a rectangular parallelepiped sealing resin 5 which seals the insulation circuit boards 2a and 2b therein, and a pair of cylindrical members 6a and 6b which is respectively provided at both right and left ends of the sealing resin 5. The semiconductor module 1 corresponds to, for example, various industrial or automotive semiconductor modules and also corresponds to a power semiconductor module in which semiconductor chips respectively disposed on the pair of insulation circuit boards 2a and 2b and not illustrated in the drawings are electrically connected to each other by a printed wiring board and a wiring (not illustrated) to become a part of an inverter circuit and the like. The pair of insulation circuit boards 2a and 2b is electrically insulated from the periphery by the sealing resin 5. FIG. 1 illustrates an example in which two insulation circuit boards are used, but the insulation circuit boards 2a and 2b may be configured as one insulation circuit board.

The sealing resin 5 is transfer-molded by using, for example, a thermosetting resin. Hereinafter, the pair of insulation circuit boards 2a and 2b arranged side by side inside the sealing resin 5 will be exemplarily described with reference to the insulation circuit board 2a at the left side of FIG. 1.

The insulation circuit board 2a includes an insulation plate 21 which is made of a ceramic plate and the like having a large insulation property, a first metal layer 22 which is provided on an upper plane of the insulation plate 21, and a second metal layer 23 which is provided on a lower plane of the insulation plate 21. A lower plane of the second metal layer 23 forms a lower plane of the insulation circuit board 2a and is exposed to a rear surface of the sealing resin 5. The exposed lower plane of the second metal layer 23 functions as a heat dissipation surface of the semiconductor module 1 having a heat dissipation baseless structure.

The first metal layer 22 and the second metal layer 23 can be formed of copper (Cu) or aluminum (Al). As the insulation circuit boards 2a and 2b, a DCB substrate which is manufactured by a Direct Copper Bonding (DCB) method or an AMB substrate which is manufactured by an Active Metal Brazing (AMB) process can be employed. In the semiconductor module 1 according to the embodiment of the invention, an AMB substrate is exemplarily used.

An upper portion of the first metal layer 22 is provided with a plurality of concave portions and a bar-shaped external terminal 3 through which an input/output current flows from the outside is provided in a standing state inside each concave portion by a bonding member such as solder so as to extend upward. The plurality of external terminals 3 extend to protrude upward such that the center portions of all bars pass through through-holes provided in a printed wiring board 4 and the upper ends of the external terminals 3 are partially exposed to the outside of the sealing resin 5. In the external terminal 3, an output current or a measurement current flows between the semiconductor module 1 and an external device connected to the semiconductor module 1.

Further, although not illustrated in the drawings, a plurality of connection pin terminals are provided in a standing state on the upper plane of the first metal layer 22 inside the sealing resin 5 by solder and the like so as to extend upward. The pin terminals are pressed against the printed wiring board 4 at the upper positions of the pin terminals to be integrally supported. Further, a semiconductor chip is mounted on the upper plane of the first metal layer 22 by solder and the like and pin terminals are also erected on the upper plane of the semiconductor chip through solder and the like to extend upward.

As a power semiconductor element forming the semiconductor chip, an Insulated Gate Bipolar Transistor (IGBT), a Metal Oxide Semiconductor Field Effect Transistor (MOSFET), a diode, and the like can be exemplified. The bonding member and the semiconductor chip are not illustrated in the drawings.

The pair of cylindrical members 6a and 6b is attached to the inner surfaces of the pair of fixed holes 5a and 5b provided at both ends of the sealing resin 5 in a contact state and the through-holes of the cylindrical members 6a and 6b are formed to penetrate the sealing resin 5 of FIG. 1 in the up to down direction. A screw for screwing the semiconductor module 1 to an external device such as a cooler is inserted into the through-holes of the cylindrical members 6a and 6b. Since the pair of cylindrical members 6a and 6b has an equivalent structure, the cylindrical member 6a at the left side of FIG. 1 will be representatively described below. The cylindrical member 6a is formed of metal and the upper end surface of the cylindrical member 6a is exposed from the upper plane of the sealing resin 5 to be flush with the upper plane of the sealing resin 5. Similarly, a bottom plane of the lower end of the cylindrical member 6a is also exposed from the lower plane of the sealing resin 5 to be flush with the lower plane of the sealing resin 5. The screws 9a and 9b correspond to "fixed members" of the invention.

An outer peripheral surface of the cylindrical member 6a extending in the up to down direction of FIG. 1 mainly includes three parts of an upper outer peripheral surface 61, a center outer peripheral surface 62, and a lower outer peripheral surface 63 in a direction from above to below.

Figure 2A:
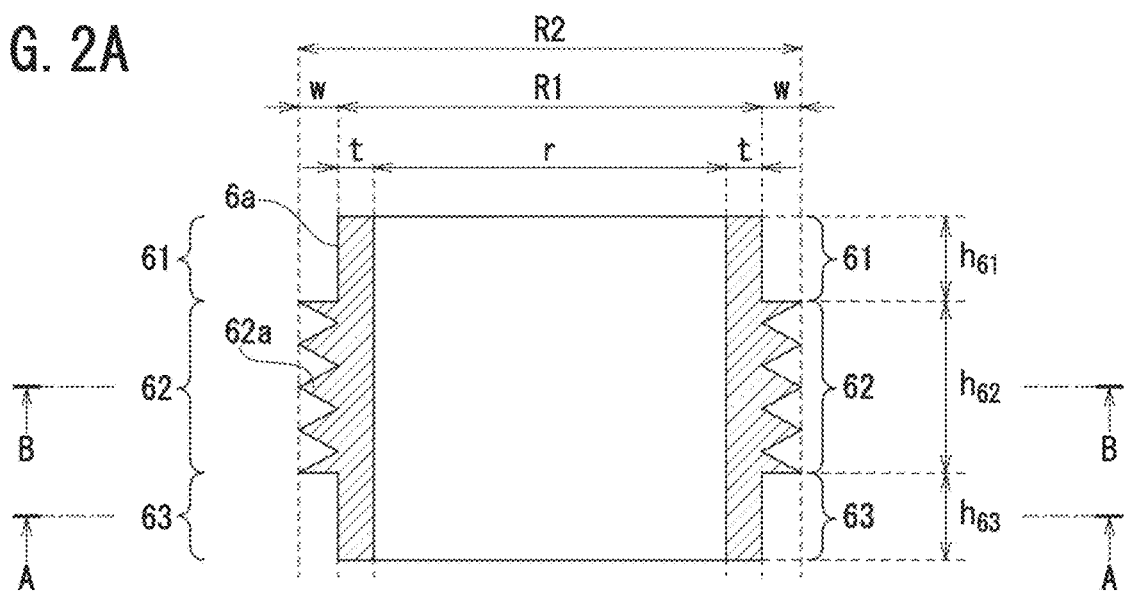
FIG. 2A is a cross-sectional view schematically describing an outline of a configuration of a cylindrical member.

As illustrated in FIG. 2A, for example, the inner diameter r of the cylindrical member 6a can be set to about 5.0 mm, the thickness t of the cylindrical member can be set to about 0.5 mm, and the outer diameter R1 at the position of the upper outer peripheral surface 61 or the lower outer peripheral surface 63 can be set to about 6.0 mm.

The upper outer peripheral surface 61 is located above the center outer peripheral surface 62 and is embedded while being in close contact with the sealing resin 5. The surface of the upper outer peripheral surface 61 is formed to be smoother than the center outer peripheral surface 62 and an area in which the cross-sectional shape of the surface is flat is continuously formed at a constant height $h_{61}$. The thickness t of the cylindrical member 6a at the height of the portion provided with the upper outer peripheral surface 61 is substantially uniform.

Figure 2B:
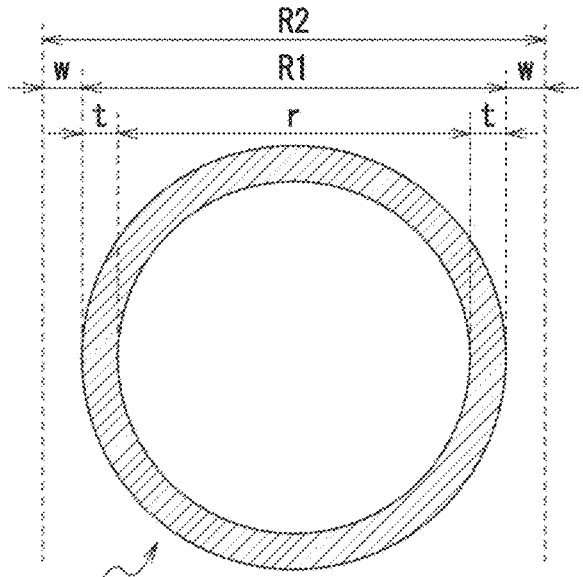
FIG. 2B is a cross-sectional view when viewed from a direction A-A of FIG. 2A.

The lower outer peripheral surface 63 is located below the center outer peripheral surface 62 and is embedded while being in close contact with the sealing resin 5. Similarly to the upper outer peripheral surface 61, the surface of the lower outer peripheral surface 63 is also formed smoother than the center outer peripheral surface 62 and an area in which the cross-sectional shape of the surface is flat is continuously formed at a constant height $h_{63}$. As illustrated in FIG. 2B, the thickness t of the cylindrical member 6a at the height of the portion provided with the lower outer peripheral surface 63 is the same as the thickness t of the portion of the upper outer peripheral surface 61 and is substantially uniform. The lower outer peripheral surface 63 corresponds to the "second outer peripheral surface" of the invention.

The center outer peripheral surface 62 is located in a center area of the cylindrical member 6a in the up to down direction and a plurality of quadrangular pyramidal protrusion portions 62a are densely arranged on the surface so that an unevenness is formed. The bottom portions of the plurality of protrusion portions 62a are located in the vicinity of the surfaces of the upper outer peripheral surface 61 and the lower outer peripheral surface 63 and the top portions of the protrusion portions protrude outward from the upper outer peripheral surface 61 and the lower outer peripheral surface 63.

Figure 2C:
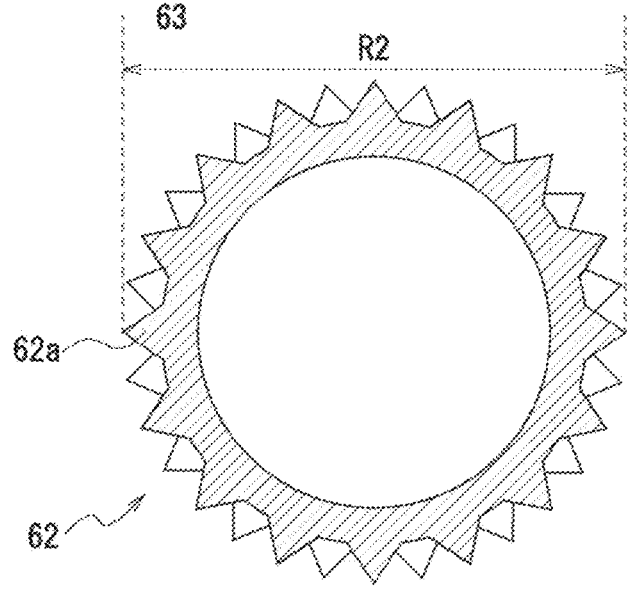
FIG. 2C is a cross-sectional view when viewed from a direction B-B of FIG. 2A.

In the case of the center outer peripheral surface 62 illustrated in FIG. 2A, an unevenness area formed by the plurality of protrusion portions 62a is continuously formed at a constant height $h_{62}$ in the up to down direction. Since the center outer peripheral surface 62 including an unevenness is embedded while being in close contact with the sealing resin 5, the cylindrical member 6a is rigidly in close contact with the sealing resin 5. The center outer peripheral surface 62 of the cylindrical member 6a corresponds to the "first outer peripheral surface" of the invention. Further, as illustrated in FIG. 2C, for example, the maximum outer diameter R2 of the position passing through the top portion of the protrusion portion 62a at the height of the center outer peripheral surface 62 can be set to about 7.0 mm and the protrusion width w of the protrusion portion 62a can be set to about 0.25 mm.

Here, the semiconductor module 1 according to the embodiment of the invention can be manufactured by transfer-molding and the like in which the pair of insulation circuit boards 2a and 2b and the pair of cylindrical members 6a and 6b are disposed inside a mold as an insert member and a molten resin flows into the mold so that these members are integrally molded.

Figure 3:
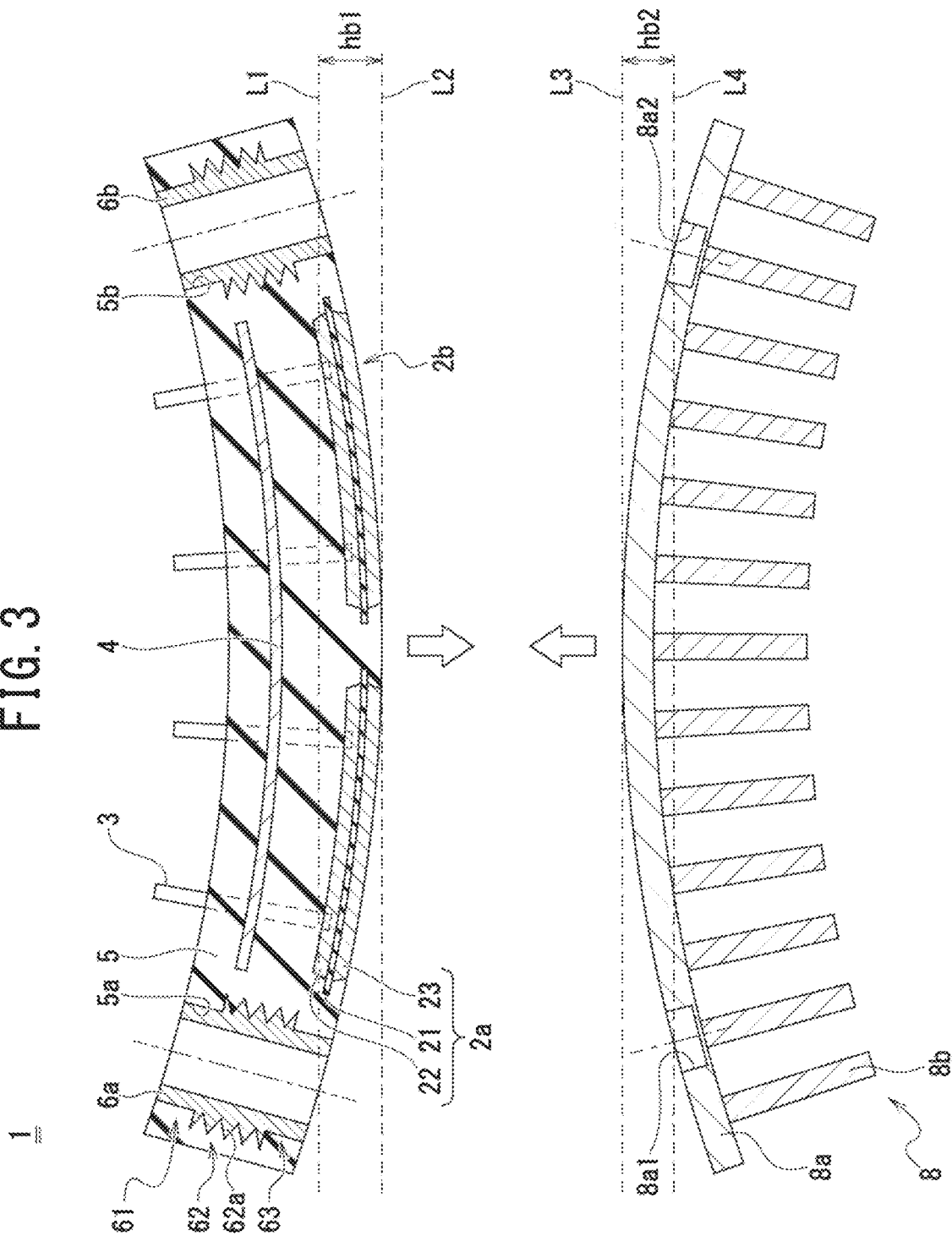
FIG. 3 is a cross-sectional view schematically describing an outline of a warped semiconductor module and a cooler immediately before assembling a semiconductor device according to the embodiment of the invention.

As illustrated in FIG. 3, when the insulation plate 21 is formed of ceramic, the linear expansion coefficients of the materials of the insulation plate 21 and the sealing resin 5 around the insulation plate 21 are largely different from each other. For that reason, when the sealing resin 5 including the insulation plate 21 at the lower side of the sealing resin is cooled during the transfer-molding so that both members are integrally solidified, the solidified semiconductor module 1 is warped in a convex shape to the lower side where the insulation plate 21 is disposed.

FIG. 3 illustrates the semiconductor module 1 which will be mounted onto a cooler 8 while the lower plane (the rear surface) of the sealing resin 5 is warped in a convex shape toward the lower cooler 8 at a constant warpage amount hb1. As indicated by a horizontal dot line in FIG. 3, the warpage amount hb1 of the semiconductor module 1 means a difference in the height direction between a line L1 which passes through the lower ends of the centers of the cylindrical members 6a and 6b and a line L2 which is parallel to the line L1 and passes through a position in which the rear plane of the sealing resin 5 is the lowest. In FIG. 3, the lower end of the rear plane of the sealing resin 5 is the lowest at the center position in the right to left direction.

The cooler 8 illustrated in FIG. 3 is a cooling fin including an attachment plate 8a which includes the semiconductor module 1 attached onto the upper plane and a plurality of heat sinks 8b which are arranged at intervals below the attachment plate 8a. The cooler 8 is made of material such as aluminum having excellent thermal conductivity and corresponds to the "external device" of the invention.

Attachment holes 8a1 and 8a2 into which screws are inserted are respectively provided in the vicinity of both right and left ends of the attachment plate 8a of FIG. 3 and the attachment holes 8a1 and 8a2 are opened to positions aligned to the holes of the fixed holes 5a and 5b of the sealing resin 5 of the semiconductor module 1 in a planar pattern. Since the heat sink 8b is attached to the lower plane side of the attachment plate 8a, the upper plane (the front plane) of the cooler 8 is also warped in a convex shape toward the semiconductor module 1 at the upper side with a constant warpage amount hb2. Furthermore, the upper plane (the surface) of the cooler 8 is also warped in a concave shape toward the semiconductor module 1 at the upper side in some cases.

The warpage amount hb2 of the cooler 8 means a difference in the height direction between a line L4 which passes through the center points of the upper ends of the attachment holes 8a1 and 8a2 of the attachment plate 8a and a line L3 which is parallel to the line L4 and passes through a position in which the front plane of the attachment plate 8a is the highest. In FIG. 3, the upper end of the front plane of the attachment plate 8a is the highest at the center position in the right to left direction. The warpage amount hb2 becomes a plus value when the line L3 is located on the side of the semiconductor module 1 in relation to the line L4 and becomes a minus value when the line L3 is located at a position separated from the semiconductor module 1 in relation to the line L4.

Figure 4:
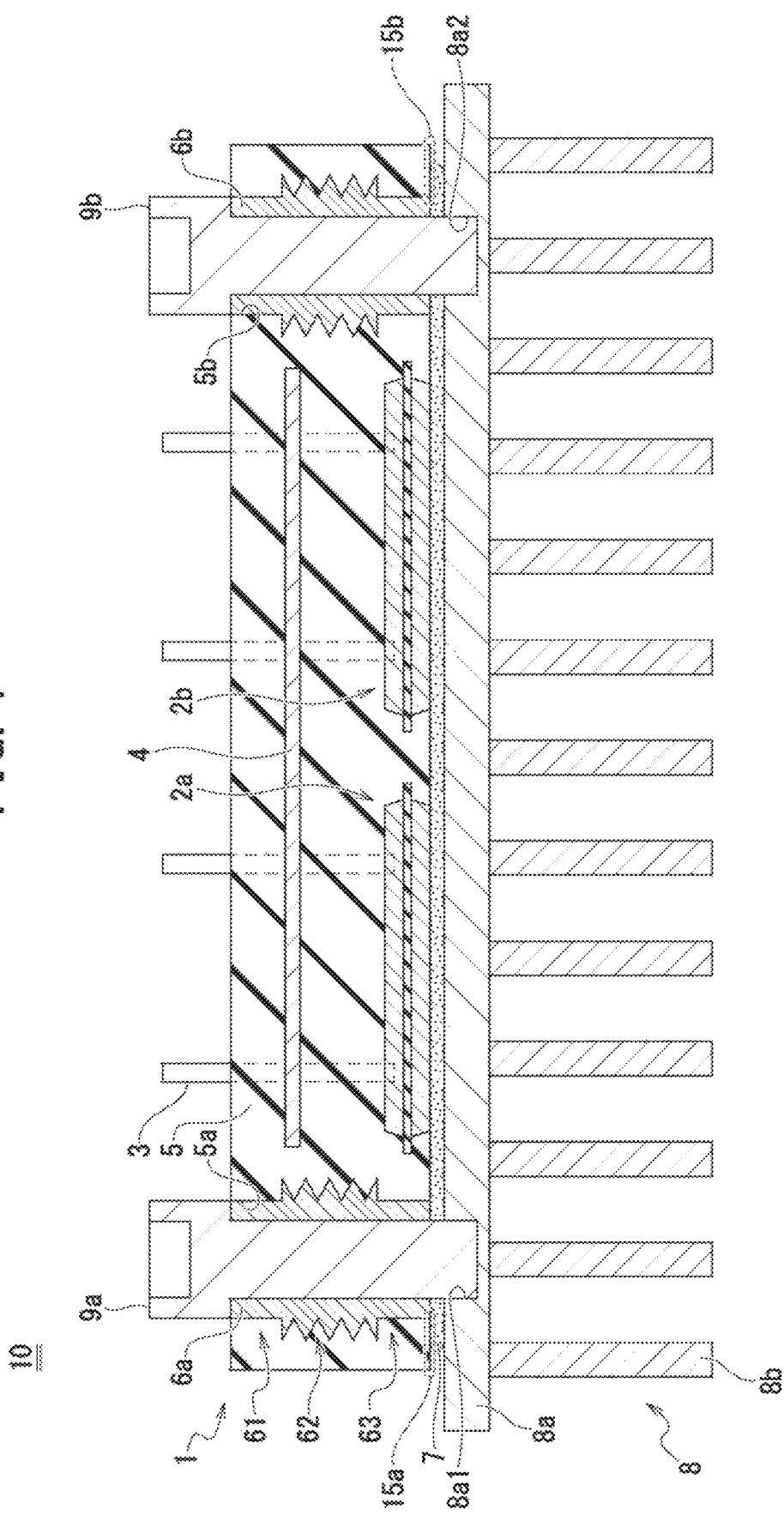
FIG. 4 is a cross-sectional view schematically describing an outline of a configuration of the semiconductor device according to the embodiment of the invention.

When the semiconductor module 1 and the cooler 8 are integrally screwed through the cylindrical members 6a and 6b, the position of the lowest lower end of the rear plane of the sealing resin 5 first overlaps the position of the highest upper end of the front plane of the attachment plate 8a. Then, a screw tightening force is applied to both ends of the sealing resin 5 so that an area facing each of the front plane of the attachment plate 8a and the rear plane of the sealing resin 5 is bound together in a direction from the periphery of the overlapping position toward both ends of the semiconductor module 1. As illustrated in FIG. 4, since the semiconductor module 1 and the cooler 8 are integrated with each other, it is possible to assemble the semiconductor device capable of improving heat dissipation performance.

For the assembly, a heat transfer material 7 such as thermal grease, heat radiation sheet, or solder which promotes the transfer of heat to the cooler 8 is provided between the semiconductor module 1 and the cooler 8. The heat transfer material 7 may be disposed on at least the rear plane of the second metal layer 23. The heat transfer material 7 may be in close contact with the entire rear plane (the entire lower plane) of the sealing resin 5 of the semiconductor module 1 and may be in close contact with the front plane (the upper plane) of the attachment plate 8a of the cooler 8. In this way, since the entire rear plane of the sealing resin 5 is in close contact with the attachment plate 8a of the cooler 8 through the heat transfer material 7, the heat transfer area can be enlarged.

As understood from the comparison of FIGS. 3 and 4, in the assembled semiconductor device 10, the attachment surfaces of the semiconductor module 1 and the cooler 8 are in close contact with each other in appearance so that the warpage state before the assembly is corrected to be zero. Meanwhile, the areas of both right and left ends of the rear plane of the sealing resin 5 are biased to be warped upward in relation to the center by the correction at the inside.

A warpage amount hb3 obtained after the semiconductor module 1 is attached to the external device (the cooler 8) means a difference in the height direction between the line L1 which passes through the center lower ends of the cylindrical members 6a and 6b after the semiconductor module 1 is attached to the external device (the cooler 8) and the line L2 which is parallel to the line L1 and is separated most from the line L1 on the rear plane of the sealing resin 5. The warpage amounts hb1 and hb3 become plus values when the line L1 moves closer to the semiconductor module 1 from the line L2 and minus values when the line L1 moves away from the semiconductor module 1 in relation to the line L2.

In the embodiment of the invention, for the correction amount by the screwing operation of the semiconductor module 1, a value obtained by subtracting the warpage amount hb3 (not illustrated) after the semiconductor module 1 is attached to the external device (the cooler 8) from the warpage amount hb1 before the semiconductor module 1 is attached to the external device (the cooler 8) is defined as a "total module deformation amount".

The rear plane of the sealing resin 5 after the semiconductor module according to the invention is attached to the external device (the cooler 8) may be warped in a convex shape downward as illustrated in FIG. 3 or may be flat without causing the warpage state as illustrated in FIG. 1. For the cooler 8, the front plane of the cooler 8 may be warped in a convex shape upward, may not cause the warpage state, or may be warped in a convex shape downward.

For example, when the long side of the rectangular parallelepiped shape of the sealing resin 5 is about 5 cm, the total module deformation amount becomes a minute level such as about 100 μm to 350 μm, but the influence of the stress applied into the sealing resin 5 with the correction of the warpage state is very large. In particular, when the cylindrical members 6a and 6b having an unevenness structure including the protrusion portion 62a are used inside the fixed holes 5a and 5b used for the screwing operation, the stress applied to the lower areas adjacent to the cylindrical members 6a and 6b of both ends inside the sealing resin 5 remarkably increases. An area in which the resin crack easily occurs at the outside of the fixed holes 5a and 5b of the lower portions of both ends of the sealing resin 5 will be defined as a "stress concentration portion". In FIG. 4, the stress concentration portions 15a and 15b are indicated by an area surrounded by a dashed line at both ends of the sealing resin 5.

Figure 5:
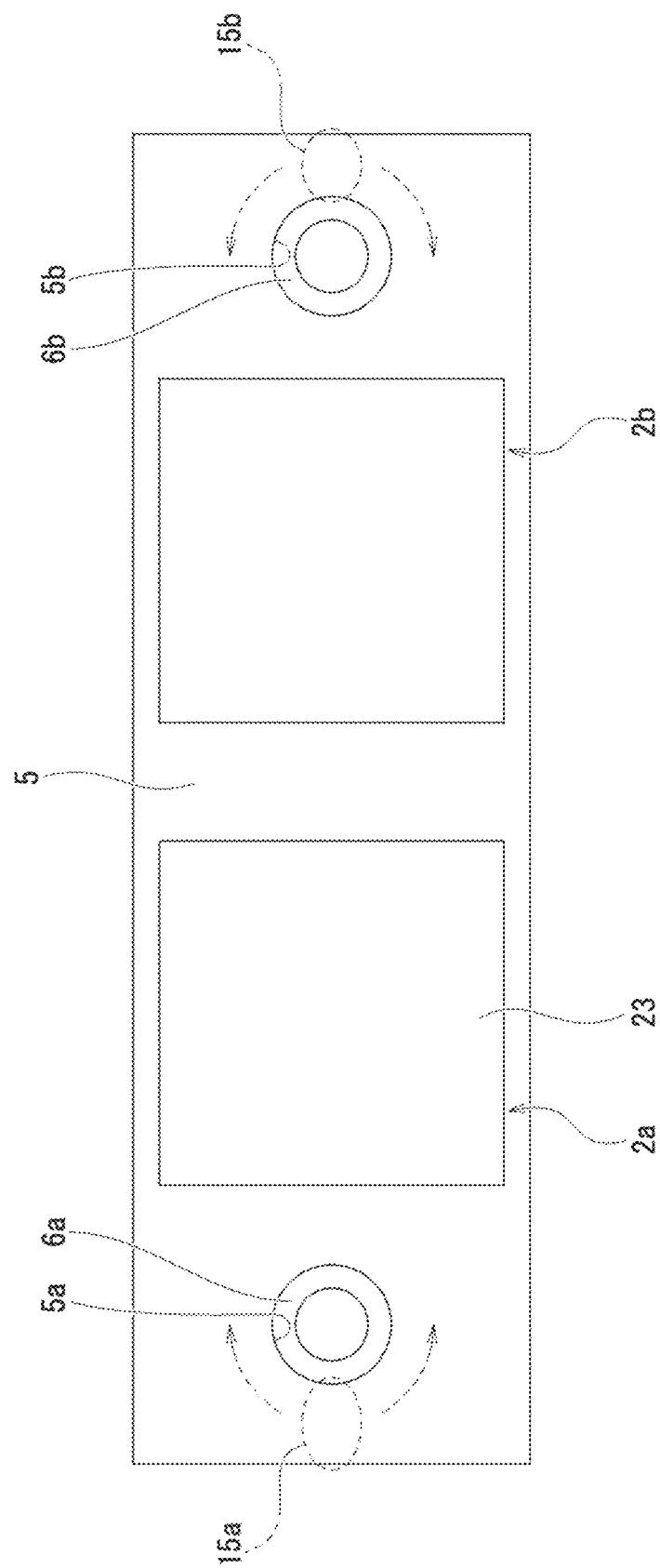
FIG. 5 is a bottom view when a rear surface of a sealing resin of the semiconductor device according to the embodiment of the invention is viewed from the front side.

As illustrated in FIG. 5, since the thickness of each of the stress concentration portions 15a and 15b, that is, the thickness of the sealing resin 5 measured in the radial direction of each of the cylindrical members 6a and 6b is thinner than those of other areas, stress easily concentrates during the screwing operation. In addition, as indicated by the dashed arrow of FIG. 5, stress is applied to the stress concentration portions 15a and 15b of the thin portion of the sealing resin 5 at the outside of the cylindrical members 6a and 6b during the screwing operation so that the sealing resin 5 is pulled inward while winding around the right and left sides of the cylinders of the cylindrical members 6a and 6b.

Due to the thin thickness of the resin portion and the screw tightening force, large stress is applied to the stress concentration portions 15a and 15b. For that reason, a resin crack easily occurs from the protruding end of the protrusion portion 62a of the unevenness structure of the center outer peripheral surface 62 of the cylindrical member 6a forming a boundary face between the inner wall surfaces of the fixed hole 5a and hence the quality of the semiconductor device 10 is largely degraded by the resin crack.

In order to prevent the resin crack, in the semiconductor module 1 according to the embodiment of the invention, the lower outer peripheral surfaces 63 of the cylindrical members 6a and 6b are formed smoothly on purpose and the lower outer peripheral surfaces 63 are disposed to face the lower portions of both ends of the sealing resin 5 corresponding to the stress concentration portions 15a and 15b. The lower outer peripheral surface 63 alleviates the stress concentrated on the stress concentration portions 15a and 15b at the time of correcting the warpage state between the semiconductor module 1 and the cooler 8 due to the screwing operation.

At the same time, since the center outer peripheral surface 62 having an unevenness structure is provided in the cylindrical members 6a and 6b at a constant height $h_{62}$, it is possible to prevent the cylindrical members 6a and 6b from being separated from the fixed holes 5a and 5b due to a force applied in the axial direction of the through-hole during the screwing operation. In this way, since the uneven center outer peripheral surface 62 and the smooth lower outer peripheral surface 63 are disposed in combination on the outer peripheral surface of one cylindrical member 6a, it is possible to prevent the resin crack of the sealing resin 5 and the separation of the cylindrical member 6a from the sealing resin 5 with a balance.

Further, in the semiconductor module 1 according to the embodiment of the invention, the height $h_{63}$ of the lower outer peripheral surface 63 is set to an appropriate ratio with respect to the entire height ($h_{61}+h_{62}+h_{63}$) for the purpose of further improving the balance between the resin crack prevention and the separation prevention.

First Example

Next, the magnitude of the stress concentrated on the stress concentration portions 15a and 15b of the screwed semiconductor module 1 was subjected to a simulation analysis. Specifically, a case was assumed such that the semiconductor module 1 including the sealing resin 5 having the warpage amount hb1 of about 65 μm was fastened to a surface plate at a constant load and was screwed.

Further, the bending strength of the sealing resin 5 in a solidified state was set to 95.8 MPa. Then, a semiconductor module in which the cylindrical members 6a and 6b, including the outer peripheral surfaces on which the uneven center outer peripheral surface 62 and the smooth lower outer peripheral surface 63 are disposed in combination, are provided at both ends of the sealing resin 5 having a set condition was set as the semiconductor module 1 according to the example.

Figure 6:
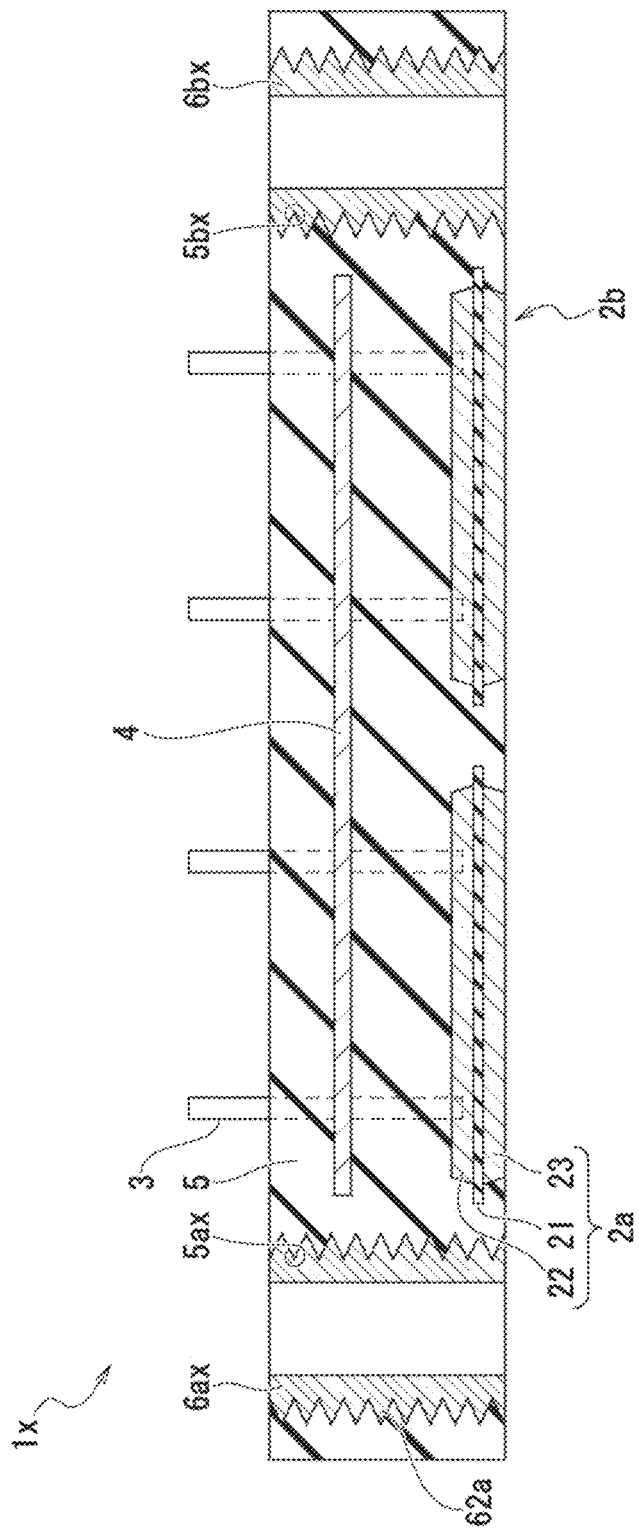
FIG. 6 is a cross-sectional view schematically describing an outline of a configuration of a semiconductor module according to a first comparative example.

Further, as illustrated in FIG. 6, a semiconductor module 1x according to a first comparative example is the same as the semiconductor module 1 according to the example in that cylindrical members 6ax and 6bx are respectively fixed to inner wall surfaces of fixed holes 5ax and 5bx provided at both ends of the sealing resin 5. However, this semiconductor module is different from the semiconductor module 1 according to the example in that the outer peripheral surfaces of the pair of cylindrical members 6ax and 6bx do not include three parts in the up to down direction as in the example, the protrusion portions 62a are densely provided in the entire outer peripheral surface in the up to down direction, and the smooth outer peripheral surface for alleviating the stress concentration of the stress concentration portions 15a and 15b is not provided at all. The other configurations of the semiconductor module 1x according to the first comparative example are the same as those of the components indicated by the same reference numerals in the semiconductor module 1 described with reference to FIGS. 1 to 5.

Figure 7:
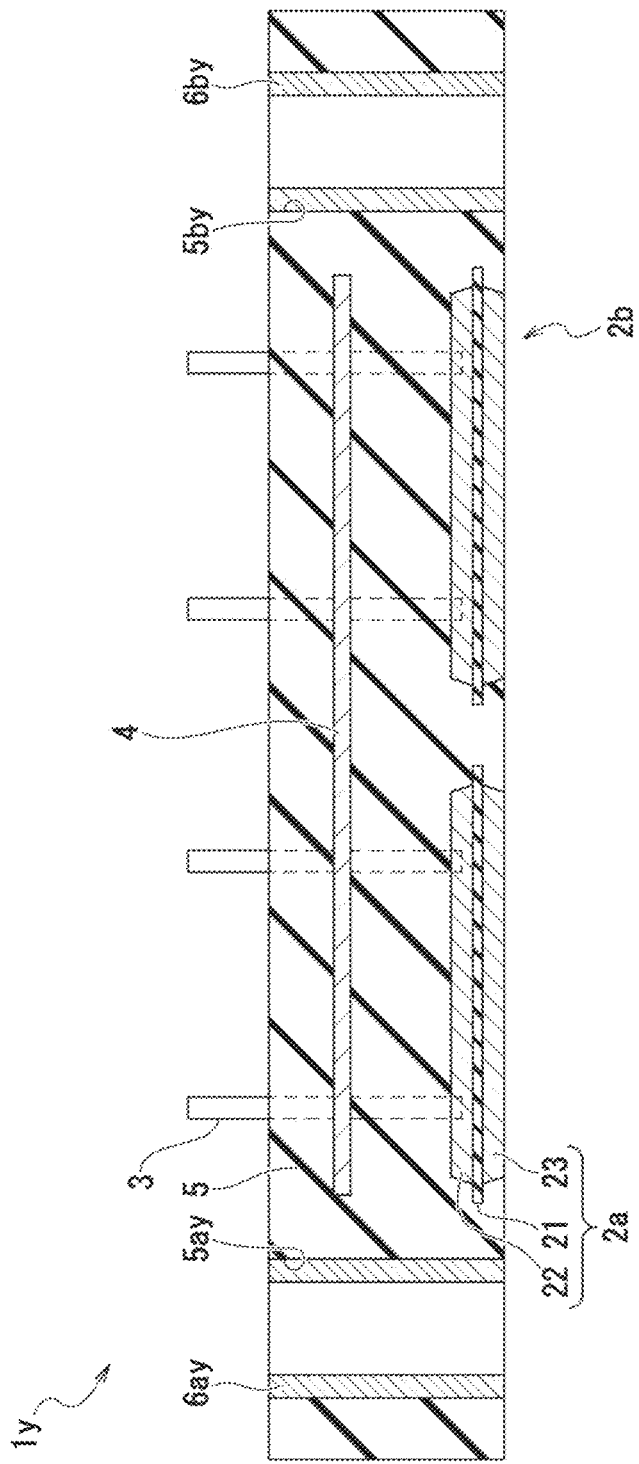
FIG. 7 is a cross-sectional view schematically describing an outline of a configuration of a semiconductor module according to a second comparative example.

Further, as illustrated in FIG. 7, a semiconductor module 1y according to a second comparative example is the same as the semiconductor module 1 according to the example in that cylindrical members 6ay and 6by are respectively fixed to inner wall surfaces of fixed holes 5ay and 5by provided at both ends of the sealing resin 5. However, this semiconductor module is different from the semiconductor module 1 according to the example in that the outer peripheral surfaces of the pair of cylindrical members 6ay and 6by are not divided into three parts in the up to down direction similarly to the example, the entire outer peripheral surface is formed smoothly, and the unevenness structure for preventing the separation of the cylindrical members 6ay and 6by is not provided at all. The other configurations of the semiconductor module 1y according to the second comparative example are the same as those of the components indicated by the same reference numerals in the semiconductor module 1 described with reference to FIGS. 1 to 5.

A surface plate to which the semiconductor modules according to the example, the first comparative example, and the second comparative example are attached was set as a so-called R surface plate which is machined to be warped in a convex shape toward the semiconductor module. Then, the warpage amount of the R surface plate was considered as the warpage amount hb2 of the cooler 8 and was set to about 100 μm. A value obtained by subtracting the warpage amount hb3 of the semiconductor module 1 after the attachment of the R surface plate from about 65 μm of the warpage amount hb1 of the semiconductor module 1 before the attachment of the R surface plate is a total module deformation amount. Here, since the R surface plate is stronger than the semiconductor module 1 and is not deformed, the warpage amount of about 165 μm corresponding to the sum of about 65 μm of the warpage amount hb1 of the semiconductor module 1 before the attachment of the R surface plate and about 100 μm of the warpage amount hb2 of the R surface plate was considered as the total module deformation amount between the actual semiconductor device attachment surfaces. Further, a screw tightening load at the time of performing the screwing operation for correcting the warpage state was set to 1.75 kN. In the above-described condition, a result obtained by analyzing the magnitude of the stress concentrated on the stress concentration portions 15a and 15b of each of the semiconductor modules according to the example, the first comparative example, and the second comparative example is shown in FIG. 8.

As shown in FIG. 8, in the case of the semiconductor module 1 according to the example, the stress applied to the stress concentration portion 15a was 66.8 MPa and the stress applied to the stress concentration portion 15b was 69.5 MPa. Meanwhile, in the case of the semiconductor module 1x according to the first comparative example, the stress applied to the stress concentration portion 15a was as very high as 119.3 MPa and the stress applied to the stress concentration portion 15b was as very high as 124.9 MPa. Further, in the case of the semiconductor module 1y according to the second comparative example, the stress applied to the stress concentration portion 15a was 64.9 MPa and the stress applied to the stress concentration portion 15b was 69.3 MPa.

Meanwhile, a cylindrical member push strength test assuming a screw tightening load was performed in addition to the simulation analysis. The semiconductor module 1 according to the example was actually prepared and an evaluation for the resin crack and the presence or absence of separation of the cylindrical members 6a and 6b was performed in a plurality of patterns in which the screwing operation was performed while the screw tightening load was set to a value smaller than 1.75 kN and different values. The evaluation result is shown in parallel with the numerical value of the stress obtained as a result of the simulation analysis in FIG. 8. In the case of the example, the resin crack substantially did not occur and the separation of the cylindrical members 6a and 6b did not occur.

Further, also in the semiconductor module 1x according to the first comparative example, the resin crack and the separation of the cylindrical members 6ax and 6bx at the time of performing the screwing operation at the same condition as that of the example were evaluated. As shown in FIG. 8, in the case of the first comparative example in which the smooth outer peripheral surface for alleviating the stress concentration is not provided at all, the separation of the cylindrical members 6ax and 6bx did not occur at all, but the resin crack actually occurred when the screw tightening load was about 1.19 kN and about 1.15 kN.

Figure 9:
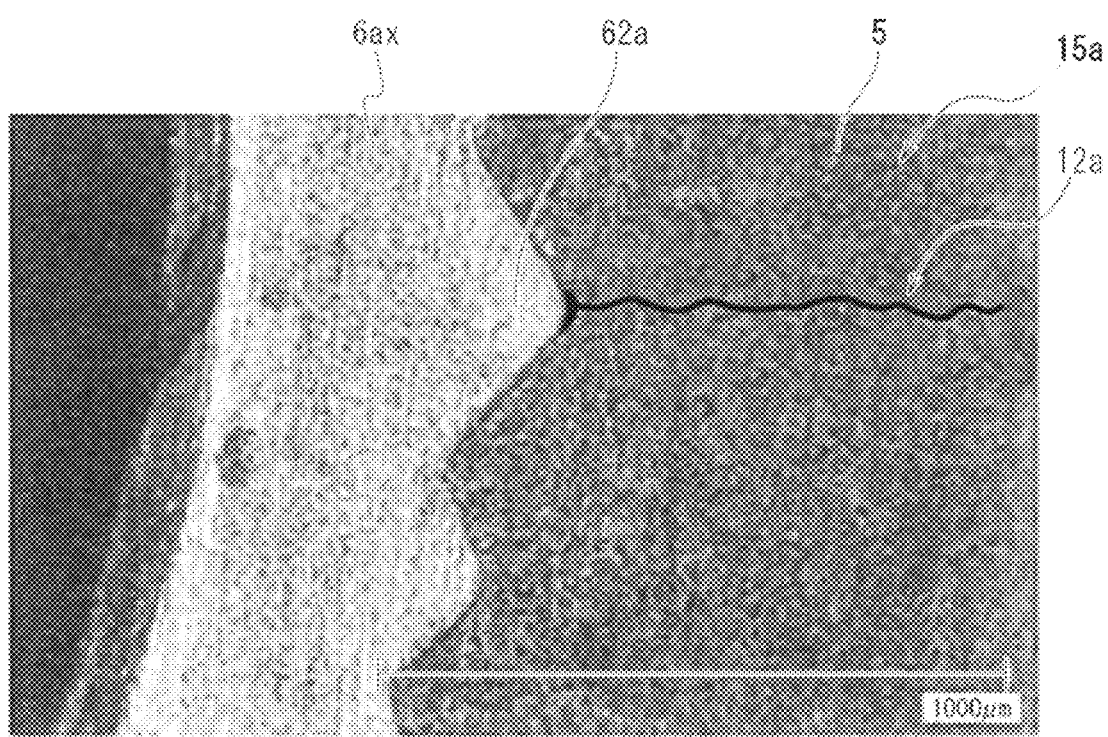
FIG. 9 is an image showing a resin crack state caused at the time of screwing the semiconductor module according to the first comparative example.
Figure 10:
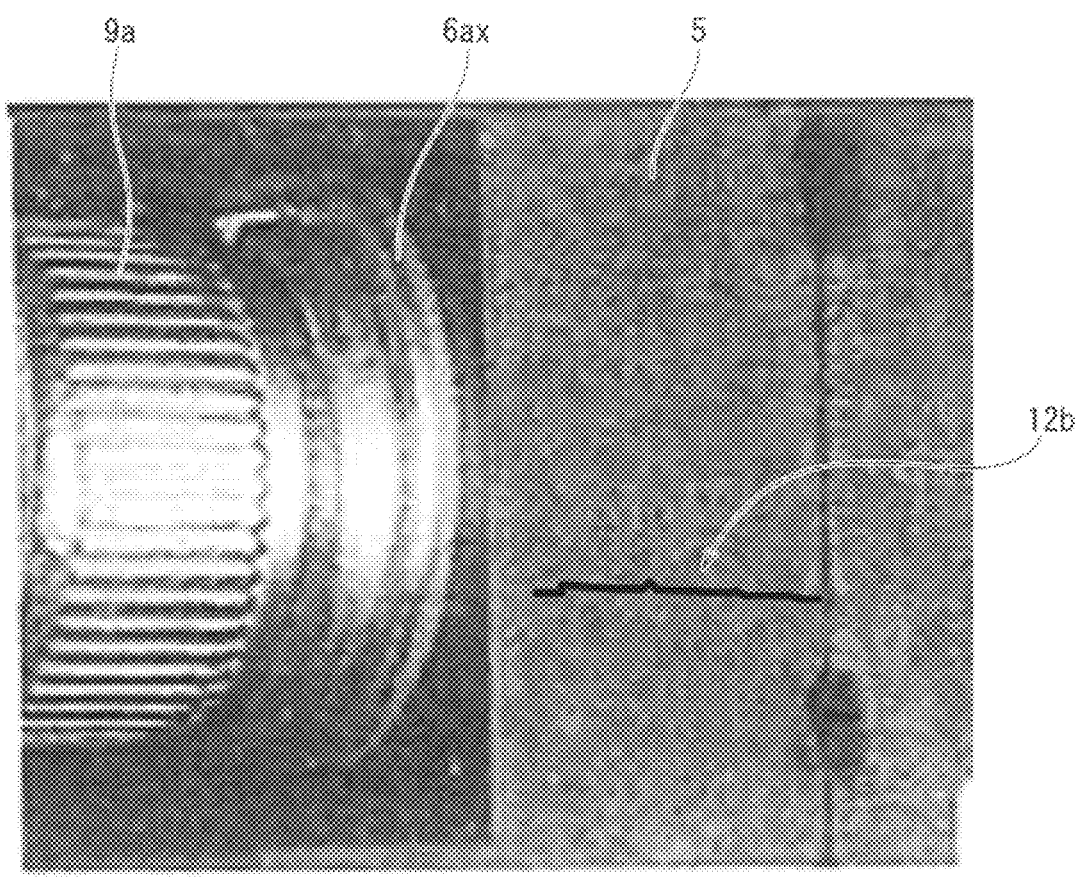
FIG. 10 is an image showing a resin crack state caused at the time of screwing the semiconductor module according to the first comparative example.

FIG. 9 shows a state in which a resin crack 12a occurs from the protrusion portion 62a at the stress concentration portion 15a of the sealing resin 5. Further, FIG. 10 shows a state in which a resin crack 12b occurs in the side wall surface of the sealing resin 5 between the cylindrical member 6ax into which a screw 9a is inserted and the stress concentration portion 15a. Furthermore, in the line of the resin crack 12a of FIG. 9 and the line of the resin crack 12b of FIG. 10, black is added for emphasis for convenience of description in order to clarify the position of the crack.

Further, also in the semiconductor module 1y according to the second comparative example, the resin crack and the separation of the cylindrical members 6ay and 6by at the time of performing the screwing operation in the same condition as those of the example and the first comparative example were evaluated.

As shown in FIG. 8, in the case of the second comparative example in which the unevenness structure for preventing the separation of the cylindrical members 6ay and 6by are not provided at all, the separation of the cylindrical members 6ay and 6by actually occurred when the screw tightening load was about 0.09 kN and about 0.04 kN. In this way, the reason why the separation of the cylindrical members 6ay and 6by occurred at a very small value of the screw tightening load was because the adhesion with the sealing resin 5 was very small since the unevenness structure was not provided at all.

Next, a cumulative failure rate F(t)[%] at the time of performing the screwing operation while changing the total module deformation amount to increase and decrease was measured for the semiconductor modules according to the example, the first comparative example, and the second comparative example. The cumulative failure rate F(t) indicates a ratio of the number of the semiconductor module having the resin crack occurring in the sealing resin 5 with respect to the number of the semiconductor module corresponding to the measurement targets.

Figure 11:
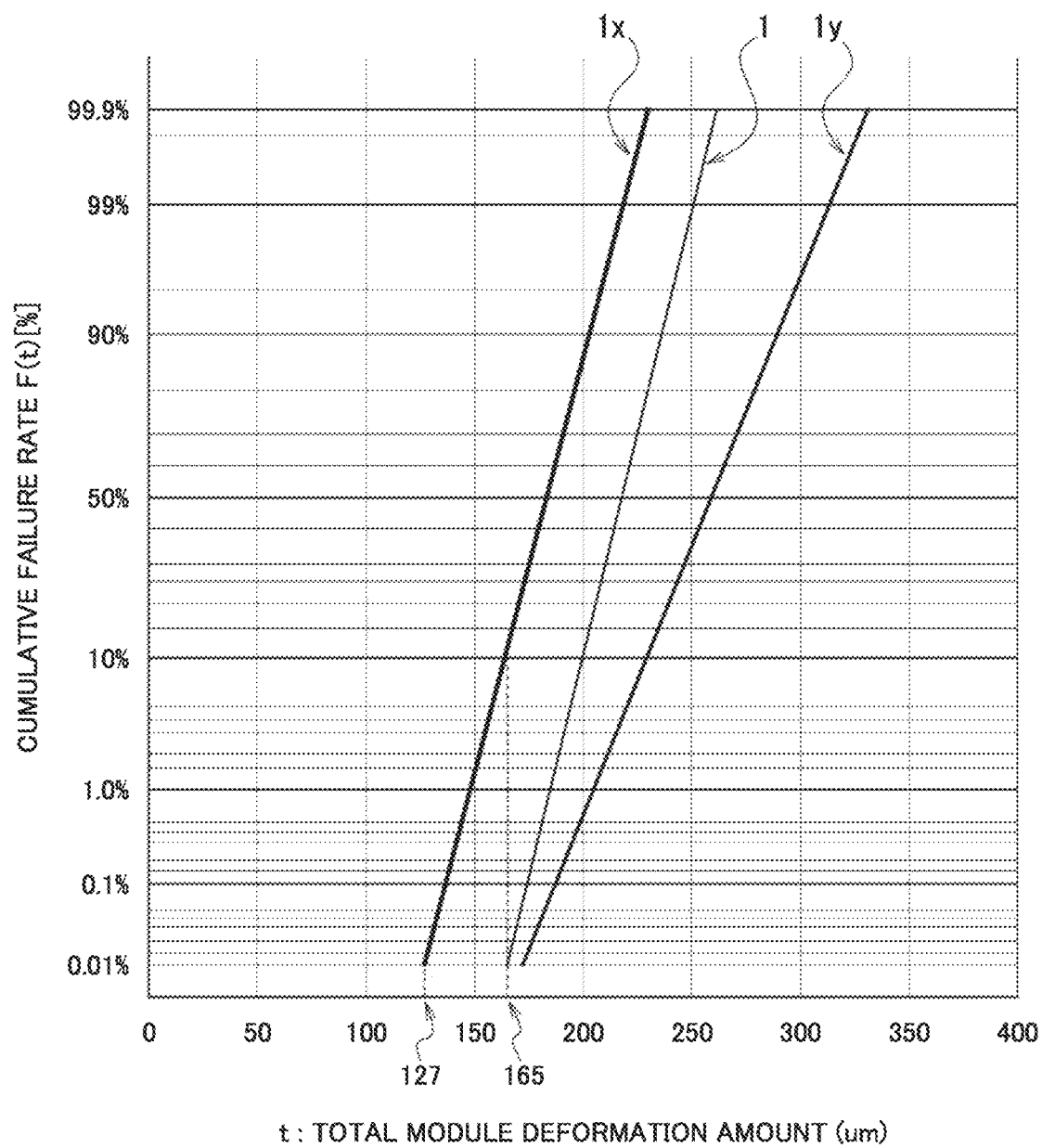
FIG. 11 is a graph showing a total module deformation amount and a cumulative failure rate of the semiconductor modules according to the example, the first comparative example, and the second comparative example.

As shown in FIG. 11, in the case of the semiconductor module 1 according to the example, it is possible to suppress the cumulative failure rate F(t) to be very low even when the same total module deformation amount is corrected as compared with the first comparative example in which the smooth outer peripheral surface is not provided at all. For example, when the total module deformation amount is about 165 µm, the cumulative failure rate F(t) of the semiconductor module 1x according to the first comparative example is about 10% and the resin crack occurs with probability of one out of 10 products.

However, in the case of the semiconductor module 1 according to the example, even when the total module deformation amount is about 165 µm, the cumulative failure rate F(t) is 0.01% and this is a probability that one resin crack occurs out of 10,000 products and the resin crack of 9,999 products can be prevented. In other words, in the case of the first comparative example in which the smooth outer peripheral surface is not provided at all and the entire surface is provided with the protrusion portion 62a, only the semiconductor device of which the total module deformation amount is about 127 µm can be set as the screwing target in order to suppress the cumulative failure rate F(t) to be 0.01% or less as shown in FIG. 11.

In the case of the semiconductor device 10 according to the embodiment of the invention, the total module deformation amount is suppressed to 165 µm or less. For that reason, the cumulative failure rate F(t) of the semiconductor device 10 can be suppressed very low to 0.01% or less.

According to the semiconductor module 1 according to the embodiment of the invention, both ends of the sealing resin 5 are provided with the cylindrical members 6a and 6b into which the screws 9a and 9b are inserted and the uneven center outer peripheral surface 62 and the smooth lower outer peripheral surface 63 are disposed in combination on the outer peripheral surface. The lower outer peripheral surface 63 alleviates large stress concentrated on the stress concentration portions 15a and 15b of the sealing resin 5 with the correction of the warpage state of the semiconductor module 1 caused by the screwing operation for connecting the semiconductor module 1 and the cooler 8.

For that reason, when a shape in which the semiconductor module 1 is warped downward in a convex shape is corrected by the screwing operation, it is possible to reliably prevent the occurrence of the resin crack which easily extends from the protrusion portion 62a of the unevenness structure of the cylindrical members 6a and 6b. Thus, it is possible to realize the semiconductor device 10 capable of sufficiently securing a binding force between the semiconductor module 1 and the cooler 8 and having high breakage tolerance for preventing the resin crack caused by the correction of the warpage state during the screwing operation.

Here, for example, a method of widening the width of the outer area in relation to the fixed holes 5a and 5b of both ends to increase the thickness can be also supposed in order to increase the strength of the sealing resin 5. However, since a product size increases, there is a disadvantage that a decrease in size of the module is not easy. Thus, according to the semiconductor module 1 of the embodiment of the invention, there is no need to largely change a dimension since only the configuration of the lower areas of the cylindrical members 6a and 6b facing the stress concentration portions 15a and 15b of the sealing resin 5 is changed when improving the breakage tolerance. Accordingly, it is very advantageous in a decrease in size of the semiconductor module. For that reason, even when the semiconductor module 1 having the same dimension level as that of the related art is used, it is possible to realize the semiconductor device 10 having high breakage tolerance with respect to the resin crack caused by the screwing operation while suppressing an increase in cost.

Further, in the semiconductor module 1 according to the embodiment of the invention, the smooth lower outer peripheral surfaces 63 of the cylindrical members 6a and 6b are disposed to face the stress concentration portions 15a and 15b of the end of the sealing resin 5. Thus, it is possible to alleviate the concentration of the inner stress on the stress concentration portions 15a and 15b of the sealing resin 5 in which the resin crack easily occurs.

Further, in the semiconductor module 1 according to the embodiment of the invention, the height $h_{63}$ of the lower outer peripheral surface 63 may be appropriately adjusted with respect to the entire height $(h_{61}+h_{62}+h_{63})$ of the cylindrical members 6a and 6b so as to alleviate the stress concentration on the stress concentration portions 15a and 15b and to prevent the separation of the cylindrical members 6a and 6b with a balance.

Further, in the semiconductor device 10 according to the embodiment of the invention, the total module deformation amount of the semiconductor module 1 is controlled to be 165 μm or less. Then, the cumulative failure rate F(t) of the semiconductor device 10 can be 0.01% or less since the warpage amount of the cooler 8 and the warpage amount of the semiconductor module 1 to be attached to the cooler 8 are respectively adjusted so that the total module deformation amount of the semiconductor module 1 attached to the cooler becomes a predetermined value or less. It is desirable that the total module deformation amount of the semiconductor module 1 to which the cooler 8 is attached be 165 μm or less.

First Modified Example

In the case of the semiconductor module 1 illustrated in FIG. 1, the entire lower outer peripheral surfaces 63 of the cylindrical members 6a and 6b were smooth. However, the entire area of the smooth lower outer peripheral surface 63 is embedded in the sealing resin 5, but the present disclosure is not limited thereto as long as constant adhesion can be obtained. Further, a structure in which at least a part is embedded in the sealing resin 5 is not excluded.

Figure 12:
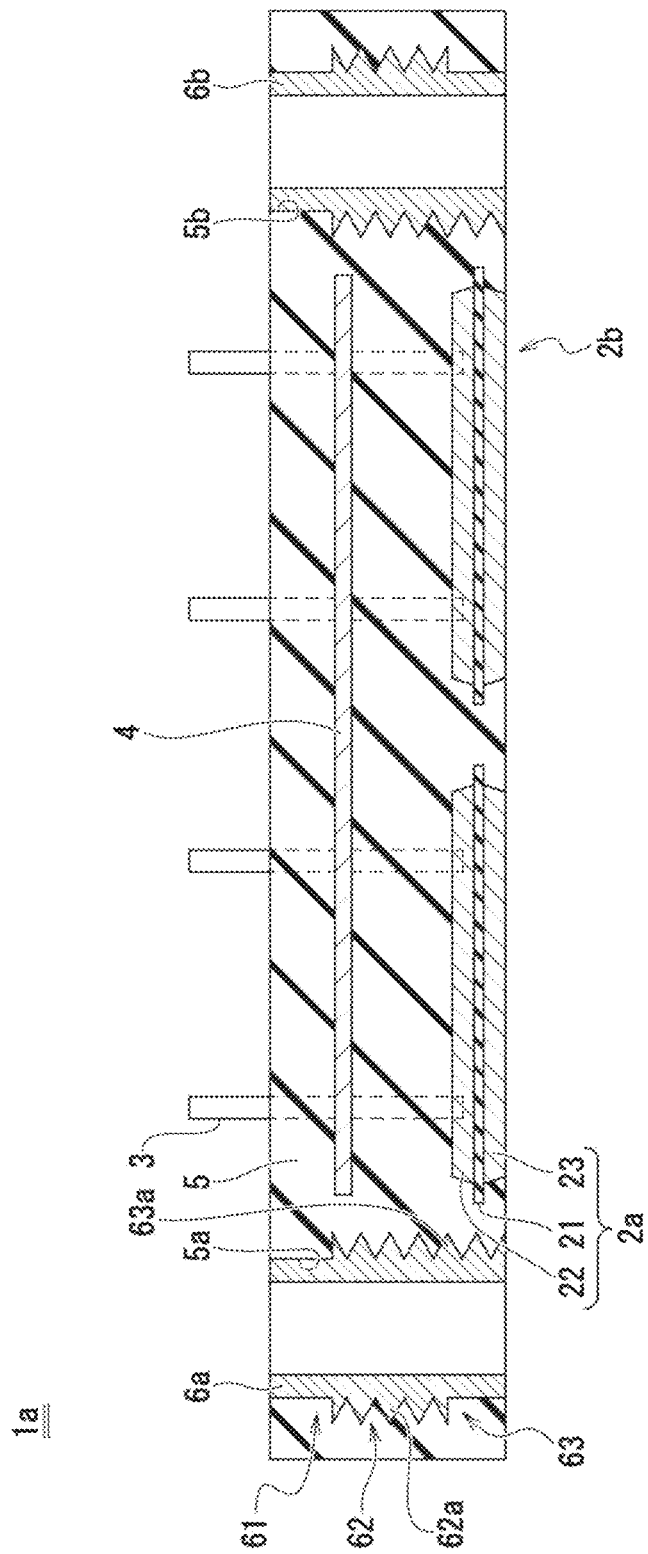
FIG. 12 is a cross-sectional view schematically describing an outline of a configuration of the semiconductor module according to the first modified example.

As illustrated in FIG. 12, in a semiconductor module 1a according to a first modified example, the side plane of the portion facing the insulation circuit board 2a of the lower outer peripheral surface 63 (the second outer peripheral surface) may be provided with an unevenness surface which is rougher than the side plane of the portion facing the end of the sealing resin of the lower outer peripheral surface 63 (the second outer peripheral surface). That is, in the lower portions of both ends of the sealing resin 5, a smooth stress alleviation structure is provided only in the side plane of the portion facing the outer stress concentration portion 15a of the cylindrical member 6a and an unevenness structure is provided in the side plane 63a of the portion facing the inner insulation circuit board 2a to the lower ends of the cylindrical members 6a and 6b. Since the other configurations except for the cylindrical members 6a and 6b of the semiconductor module 1a according to the first modified example are the same as those of the components indicated by the same reference numerals in the semiconductor module 1 described with reference to FIGS. 1 to 11, a repetitive description thereof will be omitted.

According to the first modified example, since the smooth stress alleviation structure is provided only in the side plane of the portion facing the stress concentration portion 15a and the unevenness structure is provided in the side plane of the portion facing the insulation circuit board 2a, it is possible to improve an effect of preventing the separation of the cylindrical members 6a and 6b while maintaining the resin crack prevention effect. The other effects of the semiconductor module 1a according to the first modified example are the same as those of the semiconductor module 1 described with reference to FIGS. 1 to 11.

Other Embodiments

The invention has been described with reference to the above-disclosed embodiment, but the discussion and drawings forming a part of this disclosure should not be understood as limiting the invention. Various alternative embodiments, examples, and operational techniques should be considered by those skilled in the art from this disclosure. For example, the external device is not limited to the cooler 8 as long as the semiconductor module 1 is a screwing target. Further, the cooler 8 may be a structure other than a cooling fin as long as the heat of the semiconductor module 1 can be dissipated and the air cooling or water cooling type is not limited.

Figure 13A:
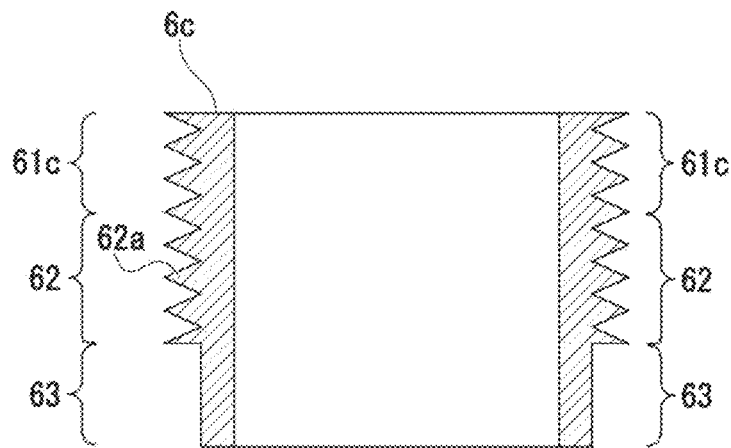
FIG. 13A is a cross-sectional view schematically describing an outline of another structure of an outer peripheral surface of the cylindrical member.

Further, as the cylindrical member, a first outer peripheral surface embedded in the sealing resin 5 and including an unevenness may be provided at the upper portion of the outer peripheral surface, a lower outer peripheral surface 63 may be provided below the outer peripheral surface to be smoother than the upper portion, and the lower end of the second outer peripheral surface may be exposed from the rear plane of the sealing resin 5. The shape of each of areas divided into three parts in the up to down direction can be appropriately changed without departing from the spirit of the invention. As illustrated in FIG. 13A, an upper outer peripheral surface 61c may not be smooth and a cylindrical member 6c including an unevenness may be used. Since the upper outer peripheral surface 61c includes an unevenness, it is possible to further improve the adhesion between the cylindrical member 6c and the sealing resin 5.

Figure 13B:
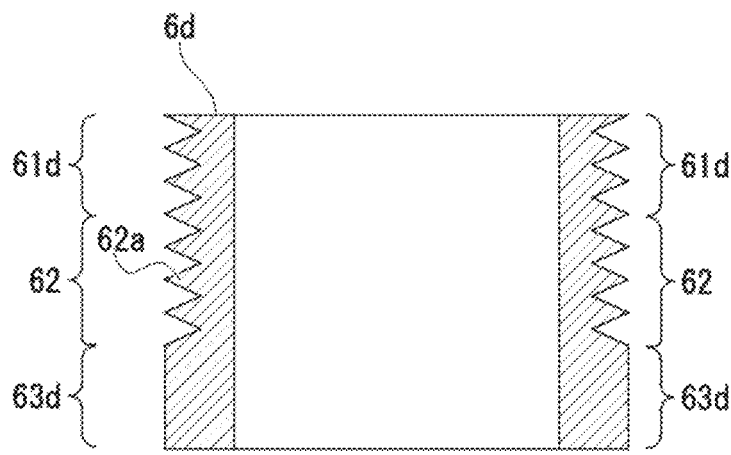
FIG. 13B is a cross-sectional view schematically describing an outline of another structure of the outer peripheral surface of the cylindrical member.
Figure 13C:
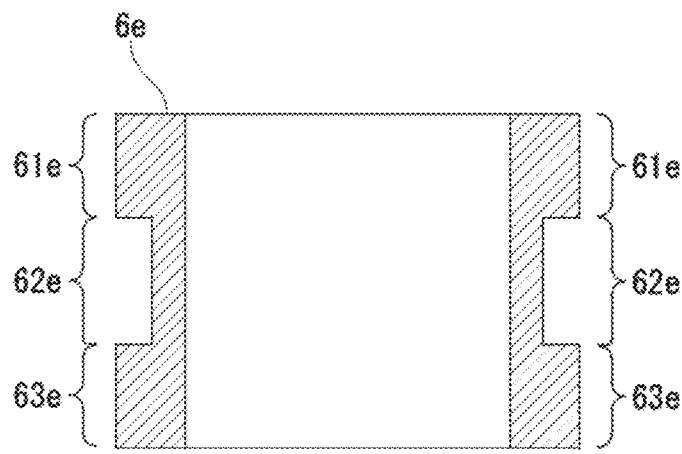
FIG. 13C is a cross-sectional view schematically describing an outline of another structure of the outer peripheral surface of the cylindrical member.

Further, as in a cylindrical member 6d illustrated in FIG. 13B, an upper outer peripheral surface 61d may include an unevenness and a lower outer peripheral surface 63d may be smooth to protrude to the same position as that of the top portion of the protrusion portion 62a of the upper center outer peripheral surface 62 or the outside of the top portion. Further, as in a cylindrical member 6e illustrated in FIG.

13C, an upper outer peripheral surface 61e and a lower outer peripheral surface 63e may be smooth and a concave portion 62e which is recessed in relation to the upper outer peripheral surface 61e and the lower outer peripheral surface 63e may be provided between the upper outer peripheral surface 61e and the lower outer peripheral surface 63e. In the cylindrical member 6e, since the unevenness structure is realized by forming the cross-sectional shape of the outer peripheral surface in a U shape as a whole, the adhesion with the sealing resin 5 is improved. Furthermore, the cross-sectional shape of the concave portion 62e is not limited to the U shape and may be other shapes such as a V shape. Further, the concave portion 62e may be provided at a plurality of positions to further improve adhesion.

Further, the shape of the sealing resin 5 may not be precisely a rectangular parallelepiped shape and can be appropriately modified. For example, a configuration may be employed in which the thickness of each of the areas of both ends provided with the cylindrical member in the up to down direction is thinner than that of the center so that a step is formed between the center and both ends.

Further, the invention is not limited to a case in which the insulation circuit boards 2a and 2b and the like are sealed by a resin at the inside by an integral molding process and can be also applied to a case in which the insulation circuit boards 2a and 2b and the like are accommodated inside a resinous casing and are sealed by a resin. For example, even when the semiconductor module is attached to the external device by inserting the screw through the cylindrical member provided at the end of the resin of the casing, it is possible to prevent the resin crack of the casing by smoothly forming the lower portion of the outer peripheral surface of the cylindrical member.

Further, it is possible to realize the semiconductor module and the semiconductor device according to the invention even when the structures of the semiconductor module and the semiconductor device illustrated in FIGS. 1 to 13 are partially combined. As described above, the invention includes various embodiments and the like which are not mentioned above and the technical scope of the invention is determined only by the particular contents of the invention according to claims reasonably derived from the description above.

What is claimed is:

1. A semiconductor module, comprising:
an insulation circuit board including a metal layer formed on a lower plane of the insulation circuit board;
a sealing resin including a rear surface and sealing the insulation circuit board so that the metal layer is exposed to the rear surface and the rear surface is warped downward in a convex shape; and
a cylindrical member including
a first outer peripheral surface embedded in the sealing resin and including an unevenness comprising a plurality of protrusion portions, and
a second outer peripheral surface provided below the first outer peripheral surface and smoother than the first outer peripheral surface and provided such that a bottom plane of a lower end of the second outer peripheral surface is exposed from the rear surface of the sealing resin and at least a part of the second outer peripheral surface above the lower end of the second outer peripheral surface is sealed by the sealing resin and is disposed near an end of the sealing resin in relation to the insulation circuit board.

2. The semiconductor module according to claim 1, wherein at least a part of the second outer peripheral surface of the cylindrical member is disposed to face the end of the sealing resin.

3. The semiconductor module according to claim 1, wherein the second outer peripheral surface includes a side plane facing the insulation circuit board having an unevenness surface which is rougher than another side plane of the second outer peripheral surface facing the end of the sealing resin, in a direction away from the insulation circuit board.

4. The semiconductor module according to claim 1, wherein an outer diameter of the cylindrical member at a position of the first outer peripheral surface is greater than an outer diameter of the cylindrical member at a position of the second outer peripheral surface.

5. The semiconductor module according to claim 1, wherein an upper end of the first outer peripheral surface is exposed at a front surface of the sealing resin and the unevenness comprising the plurality of protrusion portions extends to the front surface of the sealing resin.

6. The semiconductor module according to claim 1, wherein
the rear surface of the sealing resin is warped downward in the convex shape such that a lower end of the rear surface of the sealing resin is lowest at a center position of the sealing resin with respect to a width direction of the semiconductor module, and
the rear surface of the sealing resin is warped downward in the convex shape such that a difference in height in a depth direction of the semiconductor module exists between a plane passing through the rear surface of the sealing resin at the center position of the sealing resin and a plane passing through the rear surface of the sealing resin at an end position of the sealing resin with respect to the width direction of the semiconductor module.

7. The semiconductor module according to claim 1, further comprising:
another insulation circuit board including another metal layer formed on a lower plane of the another insulation circuit board, and
wherein
the sealing resin seals the another insulation circuit board so that the another metal layer is exposed to the rear surface, and
the sealing resin is provided between the insulation circuit board and the another insulation circuit board in a width direction of the semiconductor module.

8. A semiconductor device, comprising:
a semiconductor module including
an insulation circuit board including a metal layer formed on a lower plane of the insulation circuit board;
a sealing resin including a rear surface, sealing the insulation circuit board so that the metal layer is exposed to the rear surface, and urged so that the rear surface is warped upward in relation to a center of the rear surface; and
a cylindrical member including
a first outer peripheral surface embedded in the sealing resin and including an unevenness comprising a plurality of protrusion portions, and
a second outer peripheral surface provided below the first outer peripheral surface and smoother than the first outer peripheral surface and provided such that a bottom plane of a lower end of the second outer peripheral surface is exposed from the rear surface of the sealing resin and at least a part of the second outer peripheral surface above the lower end of the second outer peripheral surface is sealed by the sealing resin and is disposed near an end of the sealing resin in relation to the insulation circuit board;

a heat transfer material provided while being in contact with a lower plane of the metal layer of the semiconductor module;

an external device being in contact with the heat transfer material; and a fixed member inserted through the cylindrical member and fixed to the external device.

9. The semiconductor device according to claim 8, wherein at least a part of the second outer peripheral surface of the cylindrical member is disposed to face the end of the sealing resin.

10. The semiconductor device according to claim 8, wherein the second outer peripheral surface includes a side plane facing the insulation circuit board having an unevenness surface which is rougher than another side plane of the second outer peripheral surface facing the end of the sealing resin, in a direction away from the insulation circuit board.

11. The semiconductor device according to claim 8, wherein an outer diameter of the cylindrical member at a position of the first outer peripheral surface is greater than an outer diameter of the cylindrical member at a position of the second outer peripheral surface.

12. The semiconductor device according to claim 8, wherein an upper end of the first outer peripheral surface is exposed at a front surface of the sealing resin and the unevenness comprising the plurality of protrusion portions extends to the front surface of the sealing resin.

13. The semiconductor device according to claim 8, wherein
the semiconductor module further includes another insulation circuit board including another metal layer formed on a lower plane of the another insulation circuit board, and
wherein
the sealing resin seals the another insulation circuit board so that the another metal layer is exposed to the rear surface, and
the sealing resin is provided between the insulation circuit board and the another insulation circuit board in a width direction of the semiconductor module.

14. A semiconductor device, comprising:
a semiconductor module including
an insulation circuit board including a metal layer formed on a lower plane of the insulation circuit board;
a sealing resin including a rear surface, sealing the insulation circuit board so that the metal layer is exposed to the rear surface; and
a cylindrical member including
a first outer peripheral surface embedded in the sealing resin and including an unevenness comprising a plurality of protrusion portions, and
a second outer peripheral surface provided below the first outer peripheral surface and smoother than the first outer peripheral surface and provided such that a bottom plane of a lower end of the second outer peripheral surface is exposed from the rear surface of the sealing resin and at least a part of the second outer peripheral surface above the lower end of the second outer peripheral surface is sealed by the sealing resin and is disposed near an end of the sealing resin in relation to the insulation circuit board;

a heat transfer material provided while being in contact with a lower plane of the metal layer of the semiconductor module;

an external device being in contact with the heat transfer material; and a fixed member inserted through the cylindrical member and fixed to the external device, wherein
the rear surface of the sealing resin is flat at a center position of the sealing resin with respect to a width direction of the semiconductor module,
the rear surface of the sealing resin is flat at an end part of the sealing resin with respect to the width direction of the semiconductor module, the end part of the sealing resin being provided at a side of the cylindrical member facing away from the insulation circuit board, and
the lower plane of the metal layer is flat.

* * * * *